US006975187B2

(12) United States Patent
Brown et al.

(10) Patent No.: US 6,975,187 B2
(45) Date of Patent: *Dec. 13, 2005

(54) CONTINUOUSLY TUNABLE WAVEGUIDE FILTER

(75) Inventors: Stephen B. Brown, Palm Bay, FL (US); James J. Rawnick, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/414,650

(22) Filed: Apr. 16, 2003

(65) Prior Publication Data

US 2004/0207494 A1 Oct. 21, 2004

(51) Int. Cl.[7] .................................................. H03H 7/12

(52) U.S. Cl. ..................... 333/209; 333/174; 333/99 R; 333/205

(58) Field of Search ............................... 333/219, 99 R, 333/158, 179, 205, 209, 174, 208, 219.1; 324/636

(56) References Cited

U.S. PATENT DOCUMENTS

| | | | | |
|---|---|---|---|---|
| 3,701,058 A | | 10/1972 | Smith | |
| 4,260,967 A | | 4/1981 | Flieger | 333/208 |
| 5,162,972 A | | 11/1992 | Gripshover et al. | |
| 5,260,665 A | * | 11/1993 | Goldberg et al. | 324/636 |
| 6,232,853 B1 | | 5/2001 | Goulouev | 333/208 |
| 6,392,508 B1 | | 5/2002 | Damphousse et al. | 333/209 |
| 6,480,078 B2 | * | 11/2002 | Kim et al. | 333/219.1 |
| 6,515,235 B2 | | 2/2003 | Moller | |

OTHER PUBLICATIONS

U.S. Appl. No. 10/369,436, filed Feb. 18, 2003, Rawnick, et al.
U.S. Appl. No. 10/387,208, filed Mar. 11, 2003, Rawnick, et al.
U.S. Appl. No. 10/330,755, filed Dec. 27, 2002, Rawnick, et al.
U.S. Appl. No. 10/330,754, filed Dec. 27, 2002, Rawnick, et al.
U.S. Appl. No. 10/300,456, filed Nov. 19, 2002, Rawnick, et al.
U.S. Appl. No. 10/361,548, filed Feb. 10, 2003, Rawnick, et al.
U.S. Appl. No. 10/387,209, filed Mar. 11, 2003, Rawnick, et al.
U.S. Appl. No. 10/387,194, filed Mar. 11, 2003, Brown, et al.
U.S. Appl. No. 10/438,435, filed May 15, 2003, Brown, et al.
U.S. Appl. No. 10/414,696, filed Apr. 16, 2003, Brown, et al.
U.S. Appl. No. 10/637,027, filed Aug. 7, 2003, Brown, et al.
U.S. Appl. No. 10/635,629, filed Aug. 6, 2003, Brown, et al.
U.S. Appl. No. 10/459,067, filed Jun. 11, 2003, Brown, et al.

(Continued)

*Primary Examiner*—Dinh T. Le
(74) *Attorney, Agent, or Firm*—Sacco & Associates, PA

(57) ABSTRACT

A continuously variable waveguide filter (100). The variable waveguide filter can include at least one waveguide filter cavity (154, 156, 158) and a fluid dielectric (108) having a permittivity and a permeability at least partially disposed within the waveguide filter cavity (154, 156, 158). At least one composition processor (101) is included and adapted for dynamically changing a composition of the fluid dielectric (108) to vary at least one electrical characteristic. A controller (136) is provided for controlling the composition processor (101) in response to a waveguide filter control signal (137).

23 Claims, 5 Drawing Sheets

OTHER PUBLICATIONS

U.S. Appl. No. 10/438,436, filed May 15, 2003, Rawnick, et al.

U.S. Appl. No. 10/632,632, filed Aug. 1, 2003, Rawnick, et al.

U.S. Appl. No. 10/614,149, filed Jul. 7, 2003, Brown, et al.

U.S. Appl. No. 10/634,219, filed Aug. 5, 2003, Rawnick, et al.

U.S. Appl. No. 10/458,859, filed Jun. 11, 2003, Rawnick, et al.

U.S. Appl. No. 10/624,378, filed Jul. 22, 2003, Brown, et al.

U.S. Appl. No. 10/438,433, filed May 15, 2003, Rawnick, et al.

U.S. Appl. No. 10/460,947, filed Jun. 13, 2003, Rawnick, et al.

U.S. Appl. No. 10/421,352, filed Apr. 23, 2003, Rawnick, et al.

U.S. Appl. No. 10/409,261, filed Apr. 8, 2003, Pike.

U.S. Appl. No. 10/441,743, filed May 19, 2003, Pike.

U.S. Appl. No. 10/628,846, filed Jul. 28, 2003, Pike, et al.

U.S. Appl. No. 10/300,455, filed Nov. 19, 2002, Brown, et al.

Piloto, A.J., *Integrated Passive Components: A Brief Overview of LTCC Surface Mount and Integral Options.*, Kyocera America, San Diego, CA 92122.

K & L Microwave, Inc., *A Tunable, Dielectric–loaded Waveguide Filter, microwave Journal,* Aug., 1998. , <www.klmicrowave.com/news/articlearch/aug1998mj.htm>.

Sweeney, Dennis G., *Design and Construction of Waveguide Bandpass Filters,* Center for Wireless Telecommunications, Blacksburg, VA 24061.

* cited by examiner

CONTINUOUSLY TUNABLE WAVEGUIDE FILTER

BACKGROUND OF THE INVENTION

1. Statement of the Technical Field

The inventive arrangements relate generally to methods and apparatus for providing increased design flexibility for RF circuits, and more particularly to tunable waveguide filters.

2. Description of the Related Art

Waveguide filters are known to those skilled in the art of microwave communications. Waveguide filters commonly include a plurality of adjacently positioned waveguide cavities separated by shunt inductive reactance elements. The shunt inductive reactance elements are typically inductive posts which connect the broad walls of a waveguide, or openings through which adjacent cavities are coupled. For example, in a corrugated resonator configuration a slot opening is provided. In an iris configuration, a circular opening is provided. In operation, each of the waveguide cavities resonate at a frequency which is determined by cavity dimensions and the velocity of electromagnetic fields within the cavities.

In a tunable waveguide the frequency at which the cavities resonate can be adjusted. For example, in one arrangement tuning screws protrude into each waveguide cavity to adjust the waveguide filter down in frequency. As the screws protrude further into the cavity, the frequency is adjusted lower. The adjustment of a waveguide filter incorporating tunings screws is a manual process and usually only adjusts the waveguide filter by a few percentage points. Since each waveguide filter cavity has its own screw, the adjustment of such a tunable waveguide filter can be a time consuming and tedious process.

In another arrangement, dielectrically loaded waveguide filter includes two ceramic disks located on top of each other in each waveguide filter cavity. For each disk pair, a first moveable disk is connected to a stepping motor which moves the first disk with respect to a second disk. This configuration provides a tuning range of proximately 18%, but it is also very sensitive to imperfections in the ceramic disks which adversely affect waveguide filter performance. To compensate for this sensitivity, a dedicated stepping motor and drive assembly is required for each waveguide filter section. Further, the position of the movable disk in each disk pair must be individually adjusted using a complex algorithm to drive the stepper motors. Such a waveguide filter implementation is very expensive and physically large.

SUMMARY OF THE INVENTION

The present invention relates to a continuously variable waveguide filter. The variable waveguide filter can include at least one waveguide filter cavity bounded by a conductive material and having at least one aperture in the conductive material. A fluid dielectric having a permittivity and a permeability is at least partially disposed within the waveguide filter cavity. At least one composition processor is included and adapted for dynamically changing a composition of the fluid dielectric to vary an electrical characteristic of the fluid dielectric. The electrical characteristic can be a permittivity, a permeability and/or a loss tangent. A controller is provided for controlling the composition processor in response to a waveguide filter control signal.

The electrical characteristic of the fluid dielectric can be varied to vary at least one waveguide filter parameter, such as a center frequency, a cutoff frequency, a bandwidth, a quality factor (Q) or a characteristic impedance. Further, the electrical characteristic can be varied to maintain at least one waveguide filter parameter constant as a second electrical characteristic of the fluid dielectric is varied.

A plurality of component parts can be dynamically mixed together in the composition processor in response to the waveguide filter control signal to form the fluid dielectric. The component parts can be selected from the group consisting of (a) a low permittivity, low permeability component, (b) a high permittivity, low permeability component, and (c) a high permittivity, high permeability component. The fluid dielectric can include an industrial solvent which can have a suspension of magnetic particles suspended therein. The magnetic particles can consist of ferrite, metallic salts, or organo-metallic particles. In one arrangement, the fluid dielectric can contain about 50% to 90% magnetic particles by weight.

The continuously variable waveguide filter can further include at least a second waveguide filter cavity disposed within the waveguide. A second fluid dielectric can be at least partially disposed within the second waveguide filter cavity. The second fluid dielectric can have at least one electrical characteristic that is different than the electrical characteristic of the first fluid dielectric.

DETAILED DESCRIPTION OF THE PREFERRED EMBODIMENTS

The present invention provides the circuit designer with an added level of flexibility by permitting a fluid dielectric to be used in a waveguide filter, thereby enabling the dielectric properties within waveguide filter cavities to be varied. Since group velocity in a medium is inversely proportional to $\sqrt{\mu\epsilon}$, increasing the permittivity ($\epsilon$) and/or permeability ($\mu$) in the dielectric decreases group velocity of an electromagnetic field within a waveguide filter cavity, and thus the signal wavelength. Accordingly, the electrical characteristics of the fluid dielectric can be adjusted to tune the operational characteristics of a waveguide filter. For example, the permittivity and/or permeability can be selected to achieve desired waveguide filter characteristics, such as center frequency, cutoff frequency, bandwidth, quality factor (Q) and characteristic impedance. In consequence, a waveguide filter of a given size can be used for a broad range of frequencies and for different circuit impedances without altering the physical dimensions of the waveguide filter. Moreover, if the physical dimensions of the waveguide filter change, for example due to thermal expansion or contraction, during operation of the waveguide filter, the permittivity and/or permeability of the fluid dielectric can be automatically adjusted to keep the waveguide filter tuned for optimum performance. Importantly, the present invention eliminates the need for manual adjustments, such as tuning screws, to keep the waveguide filter properly tuned.

Figure 1A:
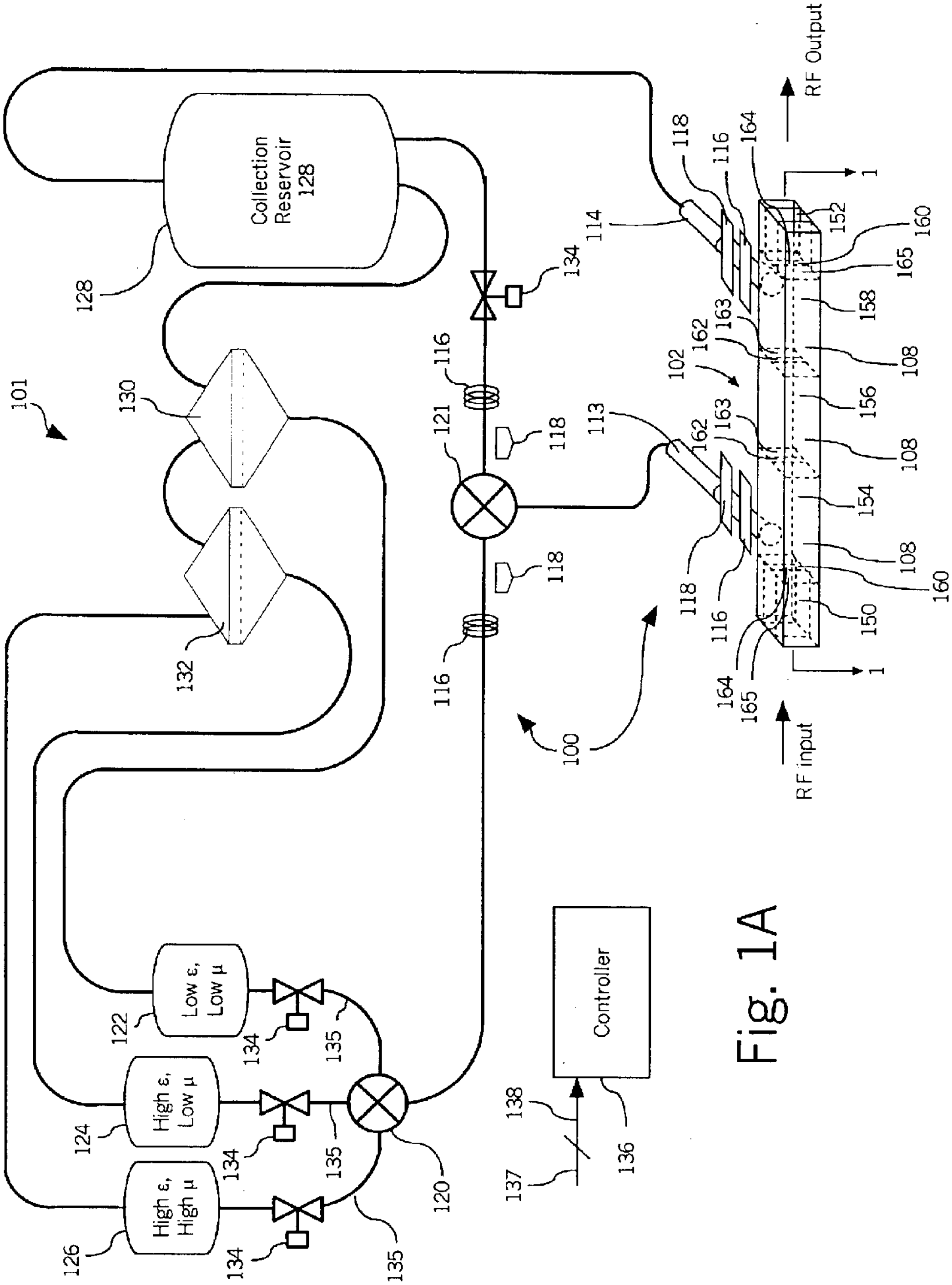
FIG. 1A is a block diagram useful for understanding the continuously variable waveguide filter in accordance with the present invention.
Figure 1B:
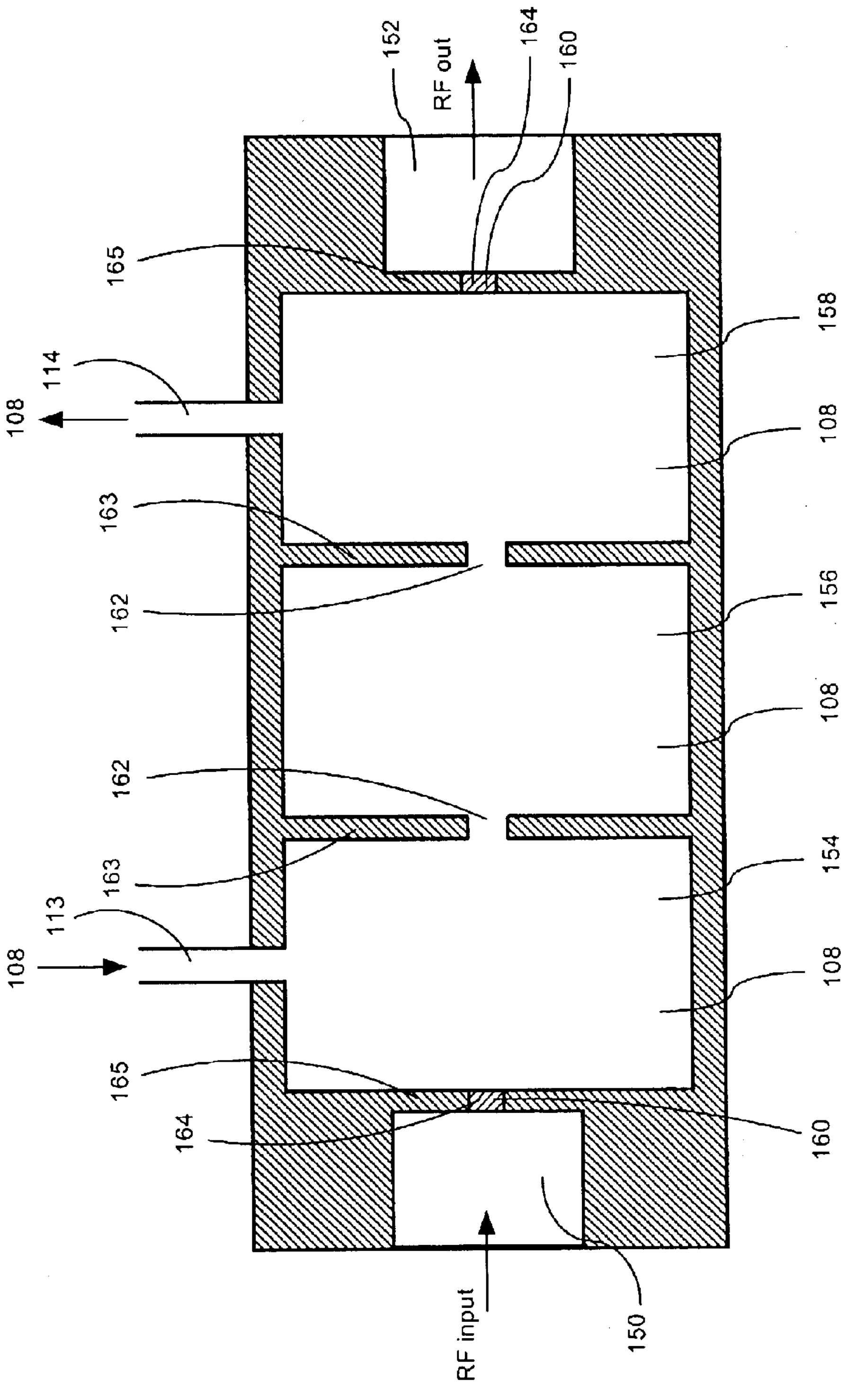
FIG. 1B is a cross sectional view of the variable waveguide filter of FIG. 1 taken along section line 1—1.

FIG. 1A is a conceptual diagram that is useful for understanding the continuously variable waveguide filter of the present invention. The waveguide filter apparatus 100 includes a waveguide filter 102 comprising an input waveguide 150, an output waveguide 152, and waveguide filter cavities 154, 156, 158. A cross section of the waveguide filter 102 taken along section lines 1—1 is shown for reference in FIG. 1B. The waveguide filter 102 can be constructed of an electrically conductive material, a magnetically conductive material, or any other material capable of supporting propagation modes. For example, the waveguide filter can be constructed of steel, brass, copper, ferrite, Invar, etc. The input waveguide 150 and output waveguide 152 can be coupled to adjacent waveguide filter cavities 154, 158, respectively, via openings 160. Further, adjacent filter cavities 154, 156, 158 are coupled to each other via openings 162 in cavity endwalls 163. The openings 162 can be slots, irises, or any other type of openings that can be used to couple filter waveguide cavities to each other and to other structures. Further, the waveguide filter cavities 154, 156, 158 can have a pre-determined geometry and can be at least partially filled with a fluid dielectric 108.

Three filter cavities are shown in the diagram, but it will be understood by those skilled in the art that the present invention is not so limited and waveguide filters with any number of filter cavities are within the scope of the present invention. Further, the waveguide filter 102 can be a low pass waveguide filter, a band pass waveguide filter, a high pass waveguide filter or any other type of waveguide filter having cavities. Moreover, the waveguide filter topology can be any waveguide filter topology.

The fluid dielectric 108 is constrained within the waveguide filter cavities 154, 156, 158. Dielectric barriers 164 can be inserted into the openings 160 in cavity endwalls 165 proximate to the input and output waveguides 150 and 152 to prevent the dielectric fluid from leaking into the waveguides 150 and 152. As with openings 162, openings 164 can be slots, irises, or any other type of opening. The dielectric barriers 164 can be glass, plastic, or any other dielectric material which is impermeable to the fluid dielectric. Accordingly, the dielectric barriers will maintain the fluid dielectric within the cavities 154, 156, 158, while having an insignificant impact on waveguide filter performance.

A composition processor 101 is provided for changing a composition of the fluid dielectric 108 to vary at least electrical characteristic of the fluid dielectric, for example the permittivity and/or permeability. In one arrangement, the loss tangent of the fluid dielectric also can be varied. A controller 136 controls the composition processor for selectively varying the electrical characteristics of the fluid dielectric 108 in response to a waveguide filter control signal 137. By selectively varying the permittivity and/or permeability of the fluid dielectric, the controller 136 can control group velocity and phase velocity of an RF signal within the waveguide filter cavities 154, 156, 158, and thus waveguide filter performance characteristics.

In particular, the resonant frequency and the bandwidth of a particular waveguide filter cavity are determined by the width and height of the cavity 154, 156, 158, the distance between the successive endwalls 163, 165, and the width or size of the openings 160, 162 formed by the endwalls 163, 165. A change in permittivity and/or permeability which results in a change in phase velocity and group velocity of a signal within a waveguide filter cavity effectively changes the relative dimensions of the waveguide filter cavity with respect to signal wavelength. Further, by selectively varying the loss tangent of the fluid dielectric, the controller 136 can vary the amount of RF energy absorbed by the fluidic dielectric, which can be dissipated in the form of heat.

Accordingly, the controller 136 can control the center frequency, cutoff frequency, bandwidth and characteristic impedance by adjusting the permittivity and/or permeability of the fluid dielectric. Further, the loss tangent also can be adjusted to tune the quality factor (Q) of the waveguide filter cavities 154, 156, 158. The quality factor can be adjusted to change the resonant characteristics and/or the bandwidth of the waveguide filter. The relationship between quality factor and loss tangent can be described by the equation $Q=1/\delta$, where $\delta$ is the loss tangent of the fluid dielectric. Accordingly, an increase in loss tangent will lower the quality factor, which results in an increase in resonance bandwidth. A decrease in loss tangent will increase the quality factor, thereby decreasing the resonance bandwidth. Further, the loss tangent can be varied to adjust the shape of the resonance skirts.

Additionally, the permittivity, permeability and/or loss tangent can be adjusted to maintain one or more waveguide filter parameters constant. For example, the permittivity and/or permeability can be adjusted to compensate for thermal expansion and contraction of the waveguide filter cavity, such as when a waveguide filter is exposed to temperature extremes or when a substantial amount of power loss occurs in the waveguide filter. Such power loss can occur in a waveguide filter which is used in high power microwave transmission applications. In such applications the loss tangent of the fluid dielectric should be minimized.

Composition of Fluid Dielectric

The fluid dielectric can be comprised of several component parts that can be mixed together to produce a desired permittivity and permeability required for a particular group velocity and waveguide filter characteristic impedance. In this regard, it will be readily appreciated that fluid miscibility and particle suspension are key considerations to ensure proper mixing. Another key consideration is the relative ease by which the component parts can be subsequently separated from one another. The ability to separate the component parts is important when the operational frequency or impedance requirements change. Specifically, this feature ensures that the component parts can be subsequently re-mixed in a different proportion to form a new fluid dielectric.

Many applications require waveguide filters to be tunable over a wide frequency range. Accordingly, it may be desirable in many instances to select component mixtures that produce a fluid dielectric that has a relatively constant response over a broad range of frequencies. If the fluid dielectric is not relatively constant over a broad range of frequencies, the characteristics of the fluid at various frequencies can be accounted for when the fluid dielectric is mixed. For example, a table of permittivity and permeability values vs. frequency can be stored in the controller 136 for reference during the mixing process.

Aside from the foregoing constraints, there are relatively few limits on the range of component parts that can be used to form the fluid dielectric. Accordingly, those skilled in the art will recognize that the examples of component parts, mixing methods and separation methods as shall be disclosed herein are merely by way of example and are not intended to limit in any way the scope of the invention. Also, the component materials are described herein as being mixed in order to produce the fluid dielectric. However, it should be noted that the invention is not so limited. Instead, it should be recognized that the composition of the fluid dielectric could be modified in other ways. For example, the component parts could be selected to chemically react with one another in such a way as to produce the fluid dielectric with the desired values of permittivity and/or permeability. All such techniques will be understood to be included to the extent that it is stated that the composition of the fluid dielectric is changed.

A nominal value of permittivity ($\epsilon_r$) for fluids is approximately 2.0. However, the component parts for the fluid dielectric can include fluids with extreme values of permittivity. Consequently, a mixture of such component parts can be used to produce a wide range of intermediate permittivity values. For example, component fluids could be selected with permittivity values of approximately 2.0 and about 58 to produce a fluid dielectric with a permittivity anywhere within that range after mixing. Dielectric particle suspensions can also be used to increase permittivity.

According to a preferred embodiment, the component parts of the fluid dielectric can be selected to include a low permittivity, low permeability component and a high permittivity, high permeability component. These two components can be mixed as needed for increasing permittivity while maintaining a relatively constant ratio of permittivity to permeability. A third component part of the fluid dielectric can include a high permittivity, low permeability component for allowing adjustment of the permittivity of the fluid dielectric independently. A high loss fluid dielectric also can be provided for selectively increasing the loss tangent of the fluid dielectric mixture. Of course, if a high loss fluid is included in the fluid dielectric mixture, the relative permittivity and relative permeability of the high loss fluid should be considered in determining the net permittivity and permeability values. Further, each of the fluid dielectrics may have a unique loss tangent. Accordingly, the loss tangent of each of the fluid dielectrics should be considered when mixing the dielectrics to achieve a specific loss tangent.

High levels of magnetic permeability are commonly observed in magnetic metals such as Fe and Co. For example, solid alloys of these materials can exhibit levels of $\mu_r$ in excess of one thousand. By comparison, the permeability of fluids is nominally about 1.0 and they generally do not exhibit high levels of permeability. However, high permeability can be achieved in a fluid by introducing metal particles/elements to the fluid. For example typical magnetic fluids comprise suspensions of ferro-magnetic particles in a conventional industrial solvent such as water, toluene, mineral oil, silicone, and so on. Other types of magnetic particles include metallic salts, organo-metallic compounds, and other derivatives, although Fe and Co particles are most common. The size of the magnetic particles found in such systems is known to vary to some extent. However, particles sizes in the range of 1 nm to 20 $\mu$m are common. The composition of particles can be varied as necessary to achieve the required range of permeability in the final mixed fluid dielectric after mixing. However, magnetic fluid compositions are typically between about 50% to 90% particles by weight. Increasing the number of particles will generally increase the permeability.

An example of a set of component parts that could be used to produce a fluidic dielectric as described herein would include oil (low permittivity, low permeability and low loss), a solvent (high permittivity, low permeability and low loss), and a magnetic fluid, such as combination of an oil and a ferrite (low permittivity, high permeability and high loss). Further, certain ferrofluids also can be used to introduce a high loss tangent into the fluidic dielectric, for example those commercially available from FerroTec Corporation of Nashua, N.H. 03060. In particular, Ferrotec part numbers EMG0805, EMG0807, and EMG1111 can be used. These fluids each exhibit a loss tangent approximately 10 to 100 times that of air. MRF-132AD is another fluid that can be used to introduce a loss tangent. MRF-132AD is commercially available from Lord Corporation of Cary, N.C. and has loss tangent approximately 5–6 times that of air. Further, the fluid has a dielectric constant between 5 and 6.

A hydrocarbon dielectric oil such as Vacuum Pump Oil MSDS-12602 could be used to realize a low permittivity, low permeability, and low loss tangent fluid. A low permittivity, high permeability fluid may be realized by mixing the hydrocarbon fluid with magnetic particles or metal powders which are designed for use in ferrofluids and magnetoresrictive (MR) fluids. For example magnetite magnetic particles can be used. Magnetite is also commercially available from FerroTec Corporation. An exemplary metal powder that can be used is iron-nickel, which can be provided by Lord Corporation. Fluids containing electrically conductive magnetic particles require a mix ratio low enough to ensure that no electrical path can be created in the mixture. Additional ingredients such as surfactants can be included to promote uniform dispersion of the particles. High permittivity can be achieved by incorporating solvents such as formamide, which inherently posses a relatively high permittivity. Fluid Permittivity also can be increased by adding high permittivity powders such as Barium Titanate manufactured by Ferro Corporation of Cleveland, Ohio. For broadband applications, the fluids would not have significant resonances over the frequency band of interest.

Processing of Fluid Dielectric for Mixing/Unmixing of Components

The composition processor 101 can be comprised of a plurality of fluid reservoirs containing component parts of fluid dielectric 108. These can include a first fluid reservoir 122 for a low permittivity, low permeability component of the fluid dielectric, a second fluid reservoir 124 for a high permittivity, low permeability component of the fluid dielectric, and a third fluid reservoir 126 for a high permittivity, high permeability component of the fluid dielectric. In one arrangement, the high permittivity, high permeability component also can be high loss. Those skilled in the art will appreciate that other combinations of component parts may also be suitable and the invention is not intended to be limited to the specific combination of component parts described herein.

A cooperating set of proportional valves 134, mixing pumps 120, 121, and connecting conduits 135 can be provided as shown in FIG. 1 for selectively mixing and communicating the components of the fluid dielectric 108 from the fluid reservoirs 122, 124, 126 to cavities 154, 156, 158. The composition processor also serves to separate out the component parts of fluid dielectric 108 so that they can be subsequently re-used to form the fluid dielectric with different permittivity and/or permeability values. All of the various operating functions of the composition processor can be controlled by controller 136. The operation of the composition processor shall now be described in greater detail with reference to FIG. 1 and the flowchart shown in FIG. 2.

Figure 2:
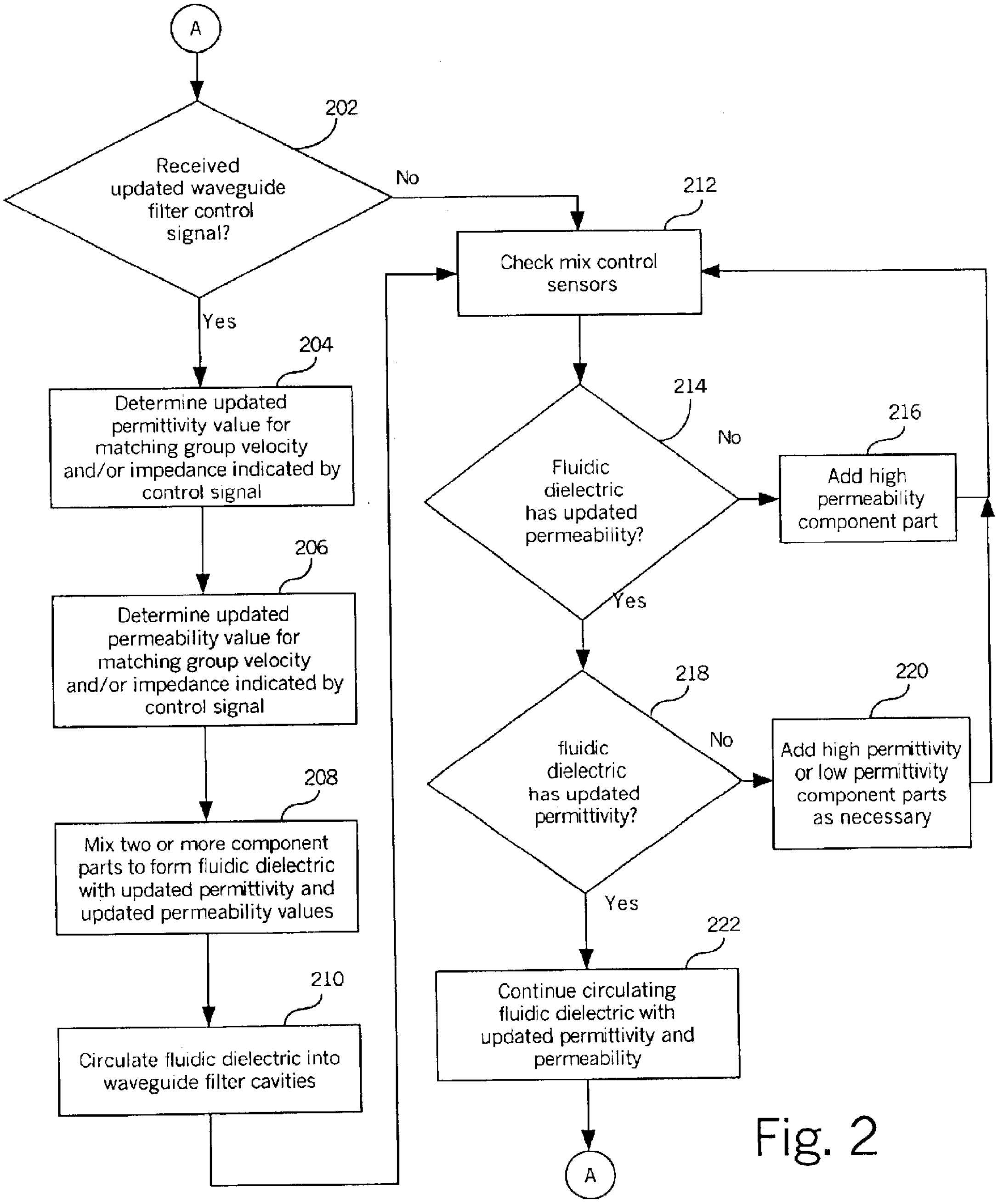
FIG. 2 is a flow chart that is useful for understanding the process of the invention.

The process can begin in step 202 of FIG. 2, with controller 136 checking to see if an updated waveguide filter control signal 137 has been received on a control signal input line 138. If so, then the controller 136 continues on to step 204 to determine an updated permittivity value for producing the group velocity or characteristic impedance indicated by the waveguide filter control signal 137. The updated permittivity value necessary for achieving the indicated group velocity or characteristic impedance can be determined using a look-up table.

In step 206, the controller can determine an updated permeability value required for maintaining a constant characteristic impedance of waveguide filter 102. In step 208, the controller 136 causes the composition processor 101 to begin mixing two or more component parts in a proportion to form fluid dielectric that has the updated permittivity and permeability values determined earlier. This mixing process can be accomplished by any suitable means. For example, in FIG. 1 a set of proportional valves 134 and mixing pump 120 are used to mix component parts from reservoirs 122, 124, 126 appropriate to achieve the desired updated permittivity and permeability.

In step 210, the controller causes the newly mixed fluid dielectric 108 to be circulated into the cavities 154, 156, 158 through a second mixing pump 121. In step 212, the controller checks one or more sensors 116, 118 to determine if the fluid dielectric being circulated through the cavities 154, 156, 158 has the proper values of permittivity and permeability. Sensors 116 are preferably inductive type sensors capable of measuring permeability. Sensors 118 are preferably capacitive type sensors capable of measuring permittivity. The sensors can be located as shown, at the input to mixing pump 121. Sensors 116, 118 are also preferably positioned to measure the permittivity and permeability of the fluid dielectric passing through input conduit 113 and output conduit 114. Note that it is desirable to have a second set of sensors 116, 118 at or near the cavities 154, 156, 158 so that the controller can determine when the fluid dielectric with updated permittivity and permeability values has completely replaced any previously used fluid dielectric that may have been present in the cavities 154, 156, 158.

In step 214, the controller 136 compares the measured permeability to the desired updated permeability value determined in step 206. If the fluid dielectric does not have the proper updated permeability value, the controller 136 can cause additional amounts of high permeability component part to be added to the mix from reservoir 126, as shown in step 216.

If the fluid dielectric is determined to have the proper level of permeability in step 214, then the process continues on to step 218 where the measured permittivity value from step 212 is compared to the desired updated permittivity value from step 204. If the updated permittivity value has not been achieved, then high or low permittivity component parts are added as necessary in step 220. If both the permittivity and permeability passing into and out of the cavities 154, 156, 158 are the proper value, the system can stop circulating the fluid dielectric and the system returns to step 202 to wait for the next updated waveguide filter control signal.

Significantly, when updated fluid dielectric is required, any existing fluid dielectric must be circulated out of the cavities 154, 156, 158. Any existing fluid dielectric not having the proper permittivity and/or permeability can be deposited in a collection reservoir 128. The fluid dielectric deposited in the collection reservoir can thereafter be re-used directly as a fourth fluid by mixing with the first, second, and third fluids or separated out into its component parts so that it may be re-used at a later time to produce additional fluid dielectric. The aforementioned approach includes a method for sensing the properties of the collected fluid mixture to allow the fluid processor to appropriately mix the desired composition, and thereby, allowing a reduced volume of separation processing to be required. For example, the component parts can be selected to include a first fluid made of a high permittivity solvent completely miscible with a second fluid made of a low permittivity oil that has a significantly different boiling point. A third fluid component can be comprised a ferrite particle suspension in a low permittivity oil identical to the first fluid such that the first and second fluids do not form azeotropes. Given the foregoing, the following process may be used to separate the component parts.

A first stage separation process would utilize distillation system 130 to selectively remove the first fluid from the mixture by the controlled application of heat thereby evaporating the first fluid, transporting the gas phase to a physically separate condensing surface whose temperature is maintained below the boiling point of the first fluid, and collecting the liquid condensate for transfer to the first fluid reservoir. A second stage process would introduce the mixture, free of the first fluid, into a chamber 132 that includes an electromagnet that can be selectively energized to attract and hold the paramagnetic particles while allowing the pure second fluid to pass which is then diverted to the second fluid reservoir. Upon de-energizing the electromagnet, the third fluid would be recovered by allowing the previously trapped magnetic particles to combine with the fluid exiting the first stage which is then diverted to the third fluid reservoir.

Those skilled in the art will recognize that the specific process used to separate the component parts from one another will depend largely upon the properties of materials that are selected and the invention. Accordingly, the invention is not intended to be limited to the particular process outlined above.

Individually Tuned Cavities

Figure 3A:
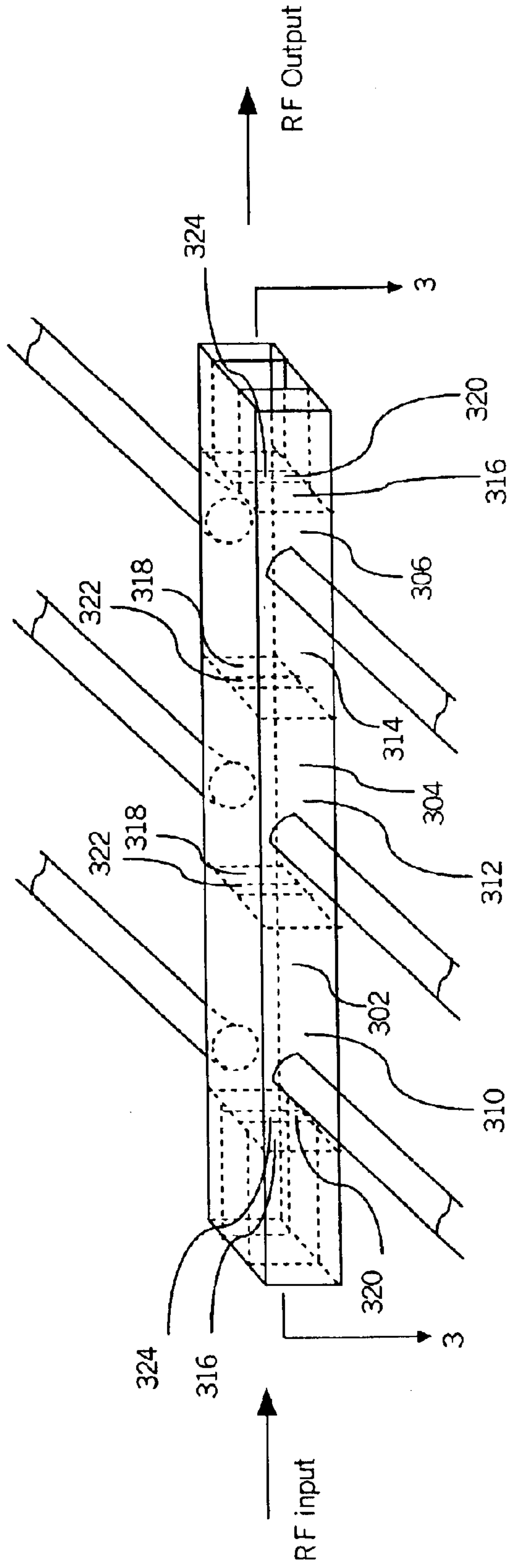
FIG. 3A is a perspective view of an alternate arrangement of the waveguide filter in accordance with the present invention.
Figure 3B:
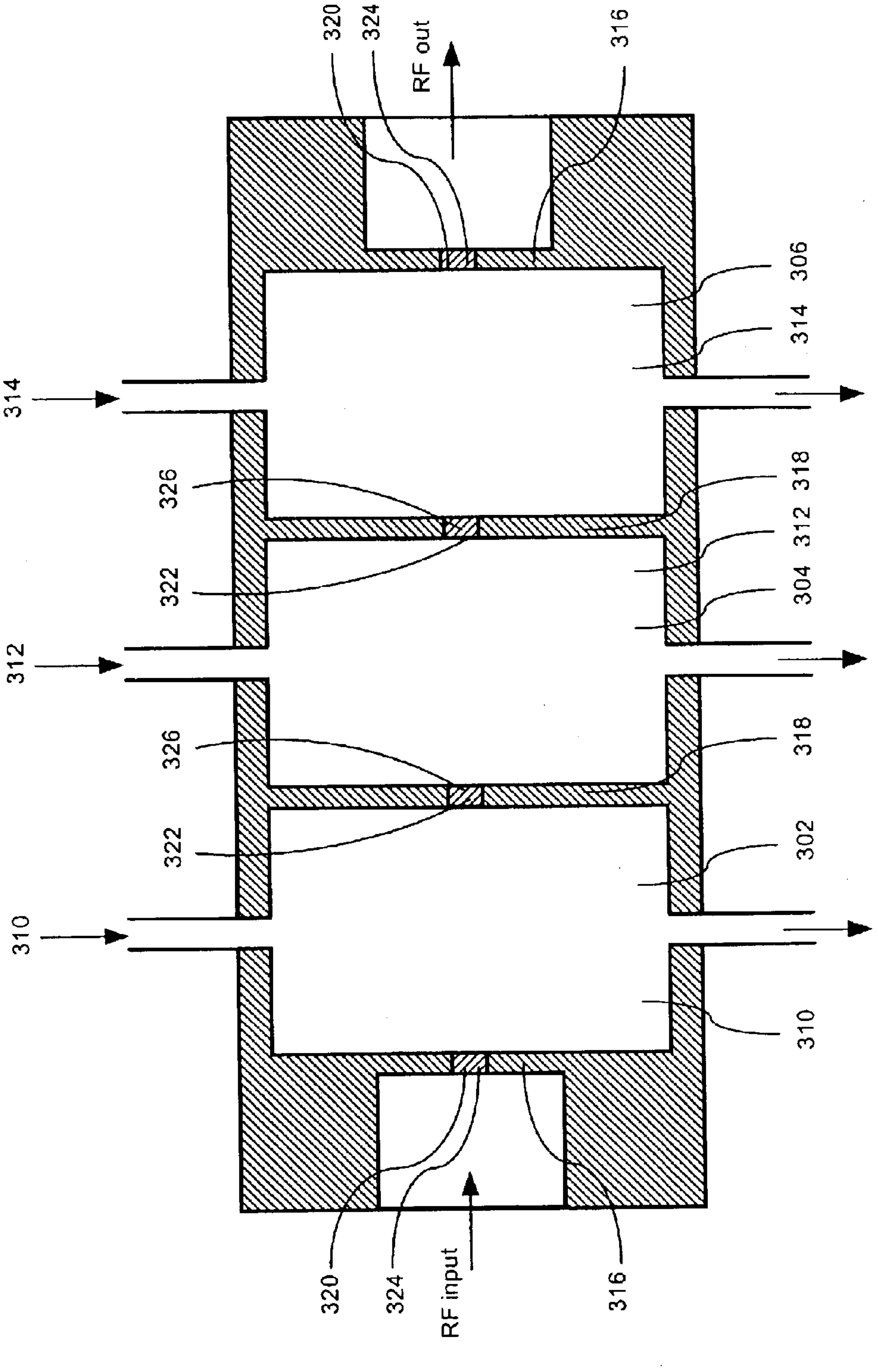
FIG. 3B is a cross sectional view of the waveguide filter of FIG. 3A taken along section line 3—3.

In addition to the waveguide filter structure shown in FIG. 1 wherein a single dielectric fluid 108 is circulated through each of the cavities 154, 156, 158, other arrangements can be implemented wherein a different dielectric fluid is provided for each cavity, as shown in FIG. 3. The composition of the dielectric fluid in each cavity 302, 304, 306 can be individually adjusted to tune waveguide filter parameters. This feature can be very useful during system development as it allows waveguide filter parameters in a prototype to be quickly and easily changed, thereby saving time and expense associated with fabricating a new waveguide filter each time an engineer wishes to fine tune waveguide filter parameters. For example, impedances of individual waveguide filter cavities 302, 304, 306 can be finely tuned to adjust a waveguide filter center frequency, cutoff frequency, bandwidth, quality factor (Q) or a characteristic impedance of a waveguide filter. Further, individual portions of the waveguide filter can be tuned to provide a different transfer functions. For example, the topology of a waveguide filter can be changed from a Butterworth topology to a Bessel topology.

Dielectric barriers 324, 326 can be inserted into the openings 320, 322 in the cavity endwalls 316, 318. As previously noted, openings 320, 322 can be slots, irises, or any other type of opening. Further, the dielectric barriers 324, 326 can be glass, plastic, or any other dielectric material which is impermeable to the fluid dielectric.

Accordingly, the dielectric barriers will isolate the fluid dielectric in each of the cavities 302, 304, 306, while having an insignificant impact on waveguide filter performance.

Notably, additional sets of proportional valves, mixing pumps and sensors (collectively referred to as a mixing apparatus) can be provided. For instance, a first mixing apparatus can mix a first fluid dielectric composition 310 for the first cavity 302, a second mixing apparatus can mix a second fluid dielectric composition 312 for the second cavity 304, and a third mixing apparatus can mix a third fluid dielectric composition 314 for the third cavity 306. In the case that each of the fluid dielectric compositions 310, 312, 314 comprise the same components, although perhaps in different ratios, a single collection reservoir 128 can be provided. Further, a single set of fluid reservoirs 122, 124 and 126, and fluid separators 130 and 132 can be provided. Alternatively, a complete composition processor can be provided for each set of cavities 302, 304, 306. It should be noted that although the example herein is presented with three sets of cavities, the invention is not so limited and any number of cavities being filled with different fluid dielectric compositions can be provided.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.:

We claim:

1. A continuously variable waveguide filter, comprising:

at least one waveguide filter cavity bounded by a conductive material and having at least one aperture in said conductive material;

a fluid dielectric at least partially disposed within said waveguide filter cavity, said fluid dielectric having a permittivity and a permeability;

at least one composition processor adapted for dynamically changing a composition of said fluid dielectric to vary at least one electrical characteristic of said fluid dielectric; and a controller for controlling said composition processor in response to a waveguide filter control signal.

2. The continuously variable waveguide filter according to claim 1 wherein said electrical characteristic is selected from the group consisting of a relative permittivity, a relative permeability and a loss tangent.

3. The continuously variable waveguide filter according to claim 1 wherein said composition processor selectively varies said electrical characteristic to vary at least one waveguide filter parameter associated with the variable waveguide filter, said waveguide filter parameter selected from the group consisting of a center frequency, a cutoff frequency, a bandwidth, a quality factor (Q) and a characteristic impedance.

4. The continuously variable waveguide filter according to claim 1 wherein said composition processor selectively varies said electrical characteristic to maintain constant at least one waveguide filter parameter associated with the variable waveguide filter when a second electrical characteristic of said fluid dielectric is varied, said waveguide filter parameter selected from the group consisting of a center frequency, a cutoff frequency, a bandwidth, a quality factor (Q) and a characteristic impedance.

5. The continuously variable waveguide filter according to claim 1 wherein a plurality of component parts are dynamically mixed together in said composition processor responsive to said waveguide filter control signal to form said fluid dielectric.

6. The continuously variable waveguide filter according to claim 1 wherein said component parts are selected from the group consisting of (a) a low permittivity, low permeability component, (b) a high permittivity, low permeability component, and (c) a high permittivity, high permeability component.

7. The continuously variable waveguide filter according to claim 1 wherein said composition processor further comprises at least one proportional valve, at least one mixing pump, and at least one conduit for selectively mixing and communicating a plurality of components of said fluid dielectric from respective fluid reservoirs to said at least one waveguide filter cavity.

8. The continuously variable waveguide filter according to claim 7 wherein said composition processor further comprises a component part separator adapted for separating said component parts of said fluid dielectric for subsequent reuse.

9. The continuously variable waveguide filter according to claim 1 wherein said fluid dielectric is comprised of an industrial solvent.

10. The continuously variable waveguide filter according to claim 9 wherein said industrial solvent has a suspension of magnetic particles contained therein.

11. The continuously variable waveguide filter according to claim 10 wherein said magnetic particles are formed of a material selected from the group consisting of ferrite, metallic salts, and organo-metallic particles.

12. The continuously variable waveguide filter according to claim 10 wherein said component contains between about 50% to 90% magnetic particles by weight.

13. The continuously variable waveguide filter according to claim 1 further comprising at least a second waveguide filter cavity disposed within said variable waveguide filter, said waveguide filter cavity bounded by a conductive material and having at least one aperture.

14. The continuously variable waveguide filter according to claim 13 wherein a second fluid dielectric is disposed within said second waveguide filter cavity, said second fluid dielectric having at least one electrical characteristic that is different than said electrical characteristic of said first fluid dielectric.

15. A method for controlling a frequency response of a waveguide type RF filter comprising the steps of:

disposing a fluid dielectric within at least one waveguide cavity defined by said RF filter, wherein said at least one waveguide cavity is positioned within a waveguide;

selectively varying at least one electrical characteristic of said fluid dielectric to modify said frequency response by changing a composition of said fluid dielectric; and varying said at least one electrical characteristic in response to a control signal.

16. A method for controlling a frequency response of a waveguide type RF filter comprising the steps of:

disposing a fluid dielectric within at least one waveguide cavity defined by said RF filter, wherein said at least one waveguide cavity is positioned within a waveguide;

selectively varying at least one electrical characteristic of said fluid dielectric to modify said frequency response by changing a composition of said fluid dielectric; and dynamically mixing together a plurality of component parts in a composition processor responsive to said waveguide filter control signal to form said fluid dielectric.

17. The method according to claim 16 further comprising the step of separating said component parts of said fluid dielectric for subsequent reuse.

18. The method according to claim 16 further comprising the step of selecting said component parts from the group consisting of (a) a low permittivity, low permeability component, (b) a high permittivity, low permeability component, and (c) a high permittivity, high permeability component.

19. A method for controlling a frequency response of a waveguide type RF filter comprising the steps of:

disposing a fluid dielectric within at least one waveguide cavity defined by said RF filter, wherein said at least one waveguide cavity is positioned within a waveguide;

selectively varying at least one electrical characteristic of said fluid dielectric to modify said frequency response; and selectively varying said at least one electrical characteristic to maintain constant at least one waveguide filter parameter associated with the waveguide type RF filter when a second electrical characteristic of said fluid dielectric is varied, said waveguide filter parameter selected from the group consisting of a center frequency, a cutoff frequency, a bandwidth, a quality factor (Q) and a characteristic impedance.

20. A method for controlling a frequency response of a waveguide type RF filter comprising the steps of:

disposing a fluid dielectric within at least one waveguide cavity defined by said RF filter, wherein said at least one waveguide cavity is positioned within a waveguide;

selectively varying at least one electrical characteristic of paid fluid dielectric to modify said frequency response; and selecting an industrial solvent to be said fluid dielectric.

21. The method according to claim 20 further comprising the step of providing a suspension of magnetic particles contained within said fluid dielectric.

22. The method according to claim 21 further comprising the step of forming said magnetic particles of a material selected from the group consisting of ferrite, metallic salts, and organo-metallic particles.

23. The method according to claim 21 further comprising the step of mixing said magnetic particles with said fluid dielectric so that a resulting mixture contains between about50% to 90% magnetic particles by weight.

* * * * *

UNITED STATES PATENT AND TRADEMARK OFFICE

CERTIFICATE OF CORRECTION

PATENT NO. : 6,975,187 B2
APPLICATION NO. : 10/414650
DATED : December 13, 2005
INVENTOR(S) : Brown et al.

It is certified that error appears in the above-identified patent and that said Letters Patent is hereby corrected as shown below:

Column 12
Claim 20, line 10, delete “paid” and replace with -- said --.
Claim 20, line 11, after “and” insert -- by changing a composition of said fluid dielectric; --.
Claim 23, line 23, delete “about50%” and replace with -- about 50% --.

Signed and Sealed this

Sixteenth Day of October, 2007

JON W. DUDAS
*Director of the United States Patent and Trademark Office*